US010678151B2

(12) United States Patent
Holz et al.

(10) Patent No.: US 10,678,151 B2
(45) Date of Patent: Jun. 9, 2020

(54) CONTROL DEVICE

(71) Applicant: Carl Zeiss SMT GmbH, Oberkochen (DE)

(72) Inventors: Markus Holz, Aalen (DE); Jan Horn, Munich (DE); Klaus Syrowatka, Ellwangen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/284,143

(22) Filed: Feb. 25, 2019

(65) Prior Publication Data

US 2019/0187574 A1 Jun. 20, 2019

Related U.S. Application Data

(63) Continuation of application No. PCT/EP2017/071135, filed on Aug. 22, 2017.

(30) Foreign Application Priority Data

Aug. 29, 2016 (DE) .................... 10 2016 216 188

(51) Int. Cl.
*G03B 27/54* (2006.01)
*G03B 27/72* (2006.01)
*G03F 7/20* (2006.01)

(52) U.S. Cl.
CPC ...... *G03F 7/70991* (2013.01); *G03F 7/70508* (2013.01)

(58) Field of Classification Search
CPC ............ G03F 7/70116; G03F 7/70775; G03F 7/70191; G03F 7/70141; G03F 7/20
See application file for complete search history.

(56) References Cited

U.S. PATENT DOCUMENTS

| 10,101,507 | B2 | 10/2018 | Yanko et al. |
| 2003/0043455 | A1 | 3/2003 | Singer et al. |
| 2005/0140955 | A1 | 6/2005 | Butler et al. |
| 2011/0235012 | A1 | 9/2011 | Fischer et al. |
| 2011/0273694 | A1* | 11/2011 | Werber ................... G02B 5/09 |
| | | | 355/67 |
| 2014/0055767 | A1 | 2/2014 | Waldis et al. |

FOREIGN PATENT DOCUMENTS

| DE | 10 2008 049 616 A1 | 4/2010 |
| DE | 10 2011 006 100 A1 | 9/2012 |
| DE | 10 2013 220 464 A1 | 11/2014 |

(Continued)

OTHER PUBLICATIONS

Translation of International Search Report and Written Opinion for corresponding PCT Appl No. PCT/EP2017/071135, dated Jan. 5, 2018.

(Continued)

*Primary Examiner* — Mesfin T Asfaw
(74) *Attorney, Agent, or Firm* — Fish & Richardson P.C.

(57) ABSTRACT

A control device for an assembly having a plurality of sensors and/or actuators includes at least one first control unit which is designed to be vacuum-suitable, has a distributor for splitting and/or combining signals and has a converter for converting digital signals into analog signals and/or analog signals into digital signals.

20 Claims, 2 Drawing Sheets

(56) References Cited

FOREIGN PATENT DOCUMENTS

| | | |
|---|---|---|
| DE | 10 2014 207 866 A1 | 10/2015 |
| DE | 10 2014 226 272 A1 | 6/2016 |
| DE | 10 2015 202 800 A1 | 8/2016 |
| EP | 1 225 481 A | 7/2002 |
| WO | WO 2010/049076 A2 | 5/2010 |
| WO | WO 2013/120926 A1 | 8/2013 |

OTHER PUBLICATIONS

German Examination Report, with translation therein, for corresponding DE Appl No. 10 2016 216 188.1, dated May 12, 2017.

* cited by examiner

CONTROL DEVICE

CROSS-REFERENCE TO RELATED APPLICATIONS

The present application is a continuation of, and claims benefit under 35 USC 120 to, international application PCT/EP2017/071135, filed Aug. 22, 2017, which claims benefit under 35 USC 119 of German Application No. 10 2016 216 188.1, filed Aug. 29, 2016. The entire disclosure of these applications are incorporated by reference herein.

FIELD

The disclosure relates to a control device, in particular a control device for an assembly having a plurality of sensors and/or actuators. The disclosure furthermore relates to an assembly comprising such a control device. Moreover, the disclosure relates to a method for controlling the displacement position of a plurality of components in a vacuum environment. Moreover, the disclosure relates to an illumination optical unit and an illumination system for a projection exposure apparatus, a projection optical unit for a projection exposure apparatus, and a projection exposure apparatus. In addition, the disclosure relates to a method for producing a microstructured or nanostructured component and to a component produced according to the method.

BACKGROUND

The positioning of the components of an EUV projection exposure apparatus can be very complex for various reasons. This is associated with the fact, inter alia, that the sensors and/or actuators for the positioning of the corresponding components are arranged in vacuo.

A device and a method for controlling the positioning of the individual mirrors of a multi-mirror array are known from DE 10 2014 207 866 A1, for example. DE 10 2013 220 464 A1 discloses a vacuum container having a specific closure for transmitting signals.

SUMMARY

The disclosure seeks to provide an improved a control device, in particular for an assembly arranged in vacuo.

In one aspect, the disclosure provides a control device for an assembly having a plurality of sensors and/or actuators. The control device includes at least one first control unit which is designed to be vacuum-suitable. The at least one first control unit has a distributor for splitting and/or combining signals. The at least one control unit also has a converter for converting digital signals into analog signals and/or analog signals into digital signals.

The heart of the disclosure includes designing the control device with at least one control unit which is designed to be vacuum-suitable, has a distributor for splitting and/or combining signals and has a converter for converting digital signals into analog signals and/or analog signals into digital signals. Distributor and converter can be combined in a single component.

The control device according to the disclosure enables a faster data connection and/or a simplified connection, in particular across a vacuum boundary.

The control unit is also referred to as distributor-converter box or simply as distributor box (dispatcher unit).

The dispatcher unit has, on the one hand, one or more purely digital inputs and/or outputs. It has, on the other hand, a plurality of analog inputs and/or outputs. The number of analog outputs is in particular greater than the number of digital inputs.

The number of analog inputs is in particular greater than the number of digital outputs.

The dispatcher unit can also have inputs for a voltage supply. As an alternative thereto, it can have an autonomous voltage supply. It can be supplied with voltage in particular by batteries or rechargeable batteries.

The number of analog outputs is preferably at least four, in particular at least six, in particular at least eight, in particular at least ten, in particular at least twelve, in particular at least twenty, in particular at least thirty, in particular at least fifty, in particular at least one hundred, in particular at least two hundred, in particular at least three hundred, in particular at least five hundred, in particular at least one thousand. It can be up to one million. In principle it can also be even greater.

The number of analog inputs is preferably at least four, in particular at least six, in particular at least eight, in particular at least ten, in particular at least twelve, in particular at least twenty, in particular at least thirty, in particular at least fifty, in particular at least one hundred, in particular at least two hundred, in particular at least three hundred, in particular at least five hundred, in particular at least one thousand. It can be up to one million. In principle it can also be even greater.

The number of digital inputs is in particular at most ten, in particular at most five, in particular at most three, in particular at most two. It can also be exactly one.

The number of digital outputs is in particular at most ten, in particular at most five, in particular at most three, in particular at most two. It can also be exactly one.

The dispatcher unit enables the detection of a plurality of analog sensor signals and/or the actuation of a plurality of actuators with analog signals. It can convert the analog sensor signals into digital signals and combine them to form a smaller number of signals. Conversely, it can convert and split a digital actuation signal into a plurality of analog actuation signals.

The control unit therefore makes it possible to replace a multiplicity of physical connections by logical connections which can be transmitted via a smaller number of physical connections, in particular a single fiber-optic cable or a single copper line pair.

The dispatcher unit can also serve for distribution of digital signals. It is possible, in particular, via the dispatcher unit, to distribute one digital line among a plurality of digital lines or conversely to combine a plurality of digital lines into one digital line. It is possible, in particular, to distribute one fast digital line among many slower digital lines.

In accordance with one aspect of the disclosure, the first control unit is connected to at least one second control unit in a data-transmitting manner.

In this case, the second control unit need not be designed to be vacuum-suitable. In particular, it can be arranged in a non-vacuum environment.

The control device includes in particular a first control unit arranged in vacuo and a second control unit arranged outside the vacuum region, the second control unit being connected to the first control unit in a data-transmitting manner.

It has been found that this enables a considerable simplification and improvement of the control device.

In accordance with a further aspect of the disclosure, the second control unit is designed as a digital assembly. It is of purely digital design, in particular. This results in advantages in the control, in particular in the closed-loop control.

In accordance with a further aspect of the disclosure, the control device includes a high-speed data connection for the signal-transmitting connection of the at least one first control unit. The first control unit is connected to the second control unit in a signal-transmitting manner in particular via a high-speed data connection.

Via the high-speed data connection, the second control unit is connected to the at least one first control unit in a data-transmitting manner. The high-speed data connection enables a data transmission rate of at least 10 Mbit/s, in particular at least 20 Mbit/s, in particular at least 30 Mbit/s, in particular at least 50 Mbit/s, in particular at least 100 Mbit/s, in particular at least 1 Gbit/s, in particular at least 10 Gbit/s. It enables in particular a data transmission with a short latency and/or a short delay. Latency and/or delay can be in particular shorter than 1 ms, in particular shorter than 0.1 ms, in particular shorter than 0.01 ms, in particular shorter than 0.001 ms.

In particular a fiber-optic connection or an electrical core pair, in particular composed of copper, can serve as high-speed data connection.

In accordance with a further aspect of the disclosure, the high-speed data connection includes a vacuum bushing.

The control device overlaps the vacuum boundary, in particular. It includes vacuum components and non-vacuum components.

In accordance with a further aspect of the disclosure, the data connection includes exclusively digital signal connections.

In accordance with a further aspect of the disclosure, the data connection includes at least one duplex data connection and/or full-duplex data connection. The duplex data connection enables a signal transmission from the non-vacuum region into the vacuum region and from the vacuum region into the non-vacuum region. In other words, it enables a data transmission in both directions. This enables a so-called closed-loop control, which is also referred to as closed control loop or simply as control loop or closed-loop control circuit. In this case, the actual controller can be arranged in the non-vacuum.

The term full-duplex data connection denotes a data connection which enables a simultaneous transmission of signals in both directions.

In accordance with a further aspect of the disclosure, the control device includes at least one closed-loop control circuit which overlaps a vacuum boundary. This should be understood to mean, in particular, that the closed-loop control circuit is arranged partly in the vacuum and partly outside the vacuum. In this case, the signals are guided through the vacuum boundary purely digitally.

Digital connections are less susceptible to interference vis-à-vis various of the electrical properties of the vacuum bushing.

The disclosure also seeks to improve an assembly including at least one displaceable component which is arranged in vacuo. In some embodiments, an assembly including a control device in accordance with the description above. The advantages are evident from those described above.

The assembly is, in particular, an optical assembly, that is to say an assembly including displaceable optical components, for example mirrors, in particular micromirrors. It can be in particular an assembly for a microlithographic projection exposure apparatus, in particular for an EUV projection exposure apparatus. It can be for example a multi-mirror array, in particular a so-called MEMS-MMA (Microelectro Mechanical System-Multi Mirror Array). It can be in particular a facet mirror of an illumination optical unit. It can also be a multi-mirror optical unit, in particular for a projection optical unit of the projection exposure apparatus.

Further, the disclosure seeks to improve a method for controlling the displacement position in a plurality of components in a vacuum environment. In certain embodiments, the disclosure provides an assembly in accordance with the description above. The heart of the disclosure consists in guiding digital signals via the vacuum boundary.

The advantages of an illumination optical unit for a projection exposure apparatus, of an illumination system for a projection exposure apparatus, of a projection optical unit for a projection exposure apparatus and of a projection exposure apparatus including an assembly in accordance with the description above are evident from those of the assembly.

In particular, an EUV projection exposure apparatus can be involved, that is to say that the radiation source can be designed as an EUV radiation source.

The projection exposure apparatus can include an illumination optical unit including at least one assembly in accordance with the description above and/or a projection optical unit including at least one assembly in accordance with the description above.

A method for producing a microstructured or nanostructured component and a correspondingly produced component, in particular a microchip, are improved by the provision of a corresponding projection exposure apparatus. The advantages are evident from those described above.

BRIEF DESCRIPTION OF THE DRAWINGS

Further advantages and details of the disclosure will become apparent from the description of a specific exemplary embodiment with reference to the figures, in which.

DESCRIPTION OF EXEMPLARY EMBODIMENTS

First of all, the basic construction of a projection exposure apparatus 1 is described below with reference to the figures.

Figure 1:
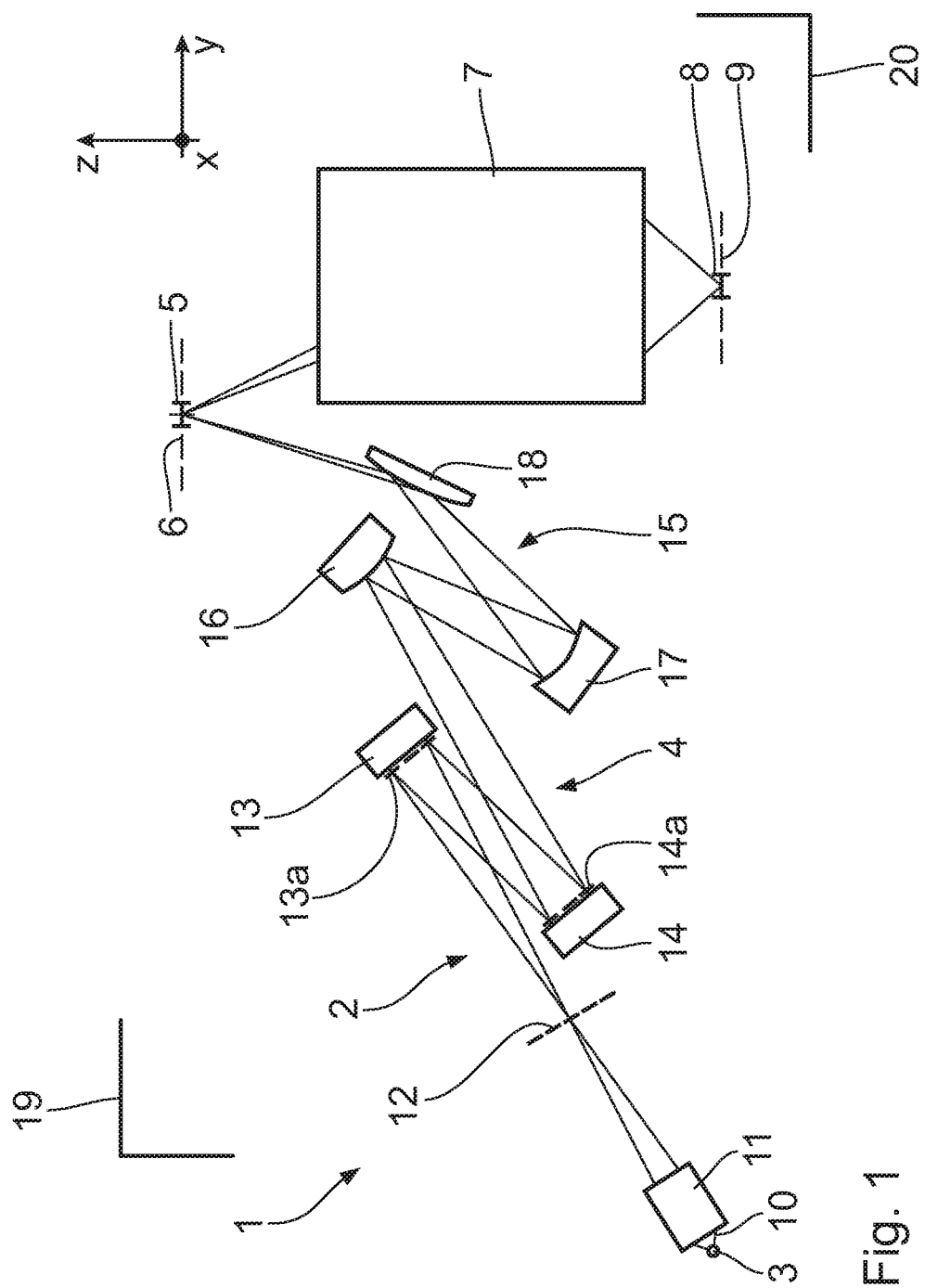
FIG. 1 shows a schematic illustration of a microlithographic projection exposure apparatus including an illumination system and a projection optical unit in meridional section.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14a. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13a which illuminate the entire object field 5 by themselves is represented by exactly one of the individual mirrors. Alternatively, it is possible to construct at least some or all of the field facets 13a using a plurality of such individual mirrors. The same correspondingly applies to the configuration of the pupil facets 14a of the pupil facet mirror 14, which are respectively assigned to the field facets 13a and which can be formed in each case by a single individual mirror or by a plurality of such individual mirrors.

The EUV radiation 10 is incident on the two facet mirrors 13, 14 at an angle of incidence that is less than or equal to 25°, measured in relation to the normal to the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet 13a of the field facet mirror 13 and a pupil facet 14a of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets 14a to the field facets 13a and correspondingly a changed configuration of the illumination channels can be achieved. This results in different illumination settings, which differ in the distribution of the illumination angles of the illumination light 10 over the object field 5.

The field facet mirror 13 is embodied in the form of a multi-mirror or micromirror array (MMA). The multi-mirror or micromirror array (MMA) is also referred to merely as a mirror array or multi-mirror array in the following text. The field facet mirror 13 is embodied as a microelectromechanical system (MEMS). It has a multiplicity of individual mirrors arranged in a matrix-like manner in rows and columns in an array. In the following text, the individual mirrors are also referred to as mirror elements. The mirror elements are designed to be tiltable by an actuator system, as will be explained below. Overall, the field facet mirror 13 has approximately 100 000 of the mirror elements. Depending on the size of the mirror elements, the field facet mirror 13 can also have for example 1000, 5000, 7000 or else hundreds of thousands of mirror elements, in particular more than 200 000, in particular more than 300 000, in particular more than 500 000.

The field facet mirror 13 can also have macroscopic field facets 13a. The number of field facets 13a is, in particular, in the range of 10 to 1000, in particular in the range of 50 to 500, in particular in the range of 100 to 300.

A spectral filter can be arranged upstream of the field facet mirror 13 and separates the used radiation 10 from other wavelength components of the emission of the radiation source 3 that are not usable for the projection exposure. The spectral filter is not illustrated.

The field facet mirror 13 is impinged on by used radiation 10 having a power of 840 W and a power density of 6.5 kW/m$^2$. The used radiation 10 can also have a different power and/or power density.

Reference is made to WO 2010/049 076 A2 in respect of further details, in particular about the arrangement of the individual mirrors and the pivotability thereof via the actuators, as well as the embodiment of the hinge bodies and thermal conduction portions.

The mirror elements each have a reflection surface. The reflection surface of the mirror elements is provided, in particular, with a (multilayer) coating for optimizing the reflectivity thereof at the wavelength of the used radiation 10. In particular, the multilayer coating enables the reflection of used radiation 10 with a wavelength in the EUV range, in particular in the range from 5 nm to 30 nm.

The illumination optical unit 4, in particular the field facet mirror 13 and the pupil facet mirror 14, are arranged in an evacuable chamber 19, which is merely indicated schematically in FIG. 1. The operating pressure in the evacuable chamber 19 is a few Pa (partial pressure of H$^2$). All other partial pressures are significantly below 10$^{-5}$ Pa.

The projection optical unit 7 is also arranged in an evacuable chamber 20, which is merely indicated schematically in FIG. 1. The operating pressure in the evacuable chamber 20 is a few Pa (partial pressure of $H^2$). All other partial pressures are significantly below $10^{-5}$ Pa.

The evacuable chamber 20 for the projection optical unit 7 can be the same chamber as the evacuable chamber 19 for the illumination optical unit 4. Two separate evacuable chambers 19, 20 can also be involved.

The components of the illumination optical unit 4 are thus situated in a vacuum environment during the operation of the projection exposure apparatus 1. The components of the projection optical unit 7 are situated in a vacuum environment during the operation of the projection exposure apparatus 1.

During use of the projection exposure apparatus 1, the reticle and the wafer, which bears a coating that is light-sensitive to the illumination light 10, are provided. Subsequently, at least one portion of the reticle is projected onto the wafer with the aid of the projection exposure apparatus 1. When projecting the reticle onto the wafer, the reticle holder and/or the wafer holder can be displaced in the direction parallel to the object plane 6 or parallel to the image plane 9. The displacement of the reticle and of the wafer can preferably be carried out in a manner synchronous to one another. Finally, the light-sensitive layer on the wafer that has been exposed with the illumination light 10 is developed. A microstructured or nanostructured component, in particular a semiconductor chip, is produced in this way.

The above description of the projection exposure apparatus 1 and the constituents thereof should be understood to be by way of example. Alternative embodiments are possible. For further details of the projection exposure apparatus 1, in particular of the multi-mirror array, reference should be made, in particular, to DE 10 2011 006 100 A1 and WO 2013/120 926 A1.

Details of a control device 31 for controlling the mirror elements of the multi-mirror array, in particular the field facets 13a, are described below. In principle, the control device 31 can also be a control device for controlling the positioning of the components, in particular the mirrors, of the projection optical unit 7. Generally, the control device 31 is a control device for an assembly having a plurality of sensors $32_i$ and/or actuators $33_i$. The number n of sensors $32_i$ is in particular at least 10, in particular at least 20, in particular at least 30, in particular at least 50, in particular at least 100, in particular at least 200, in particular at least 300, in particular at least 500, in particular at least 1000. It can be up to 1 000 000. In principle, it can also be even greater. The number m of actuators $33_i$ is in particular at least 10, in particular at least 20, in particular at least 30, in particular at least 50, in particular at least 100, in particular at least 200, in particular at least 300, in particular at least 500, in particular at least 1000. It can be up to 1 000 000. In principle, it can also be even greater.

Figure 2:
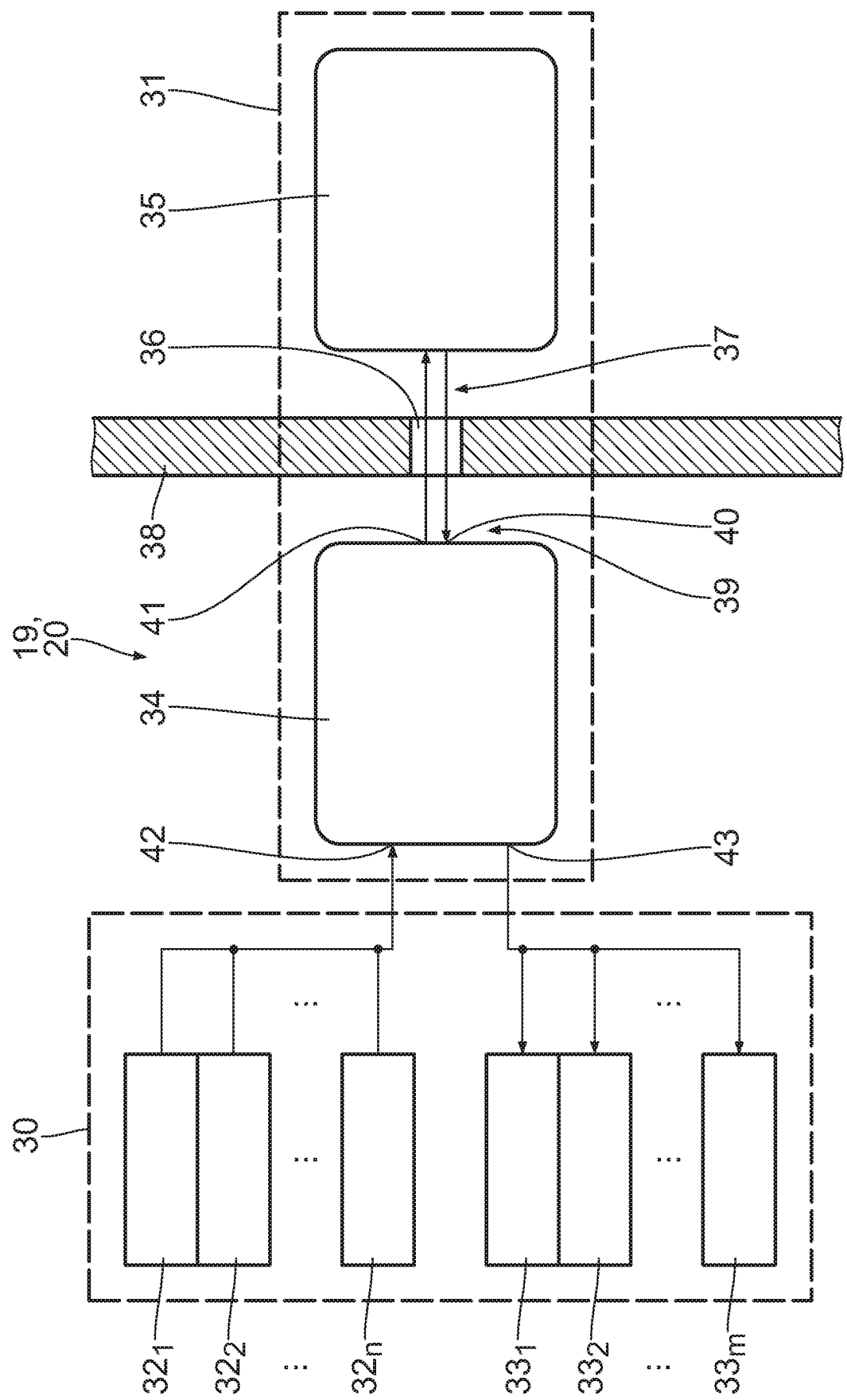
FIG. 2 schematically shows an illustration of a control device for an assembly including a plurality of sensors and a plurality of actuators.

From the assembly 30 to be controlled via the control device 31, only an excerpt having sensors $32_i$ and actuators $33_i$ is illustrated in FIG. 2. The assembly can be a constituent of the illumination optical unit 4, in particular the field facet mirror 13 or the pupil facet mirror 14. In this case, the sensors $32_i$ and actuators $33_i$ are connected to the mirror elements forming the field facets 13a or the pupil facets 14a in a signal-transmitting manner.

The assembly 30 can also be one or more constituents of the projection optical unit 7, in particular the mirrors thereof.

The control device 31 includes a first control unit 34 and a second control unit 35. The first control unit 34 is arranged in the vacuum, in particular in the evacuable chamber 19 and/or 20. The second control unit 35 is arranged in the non-vacuum, in particular outside the evacuable chambers 19, 20.

The first control unit 34 is designed in particular to be vacuum-suitable. It can be arranged at a container closed in a vacuum-tight manner. For details of such a container, reference should be made to DE 10 2013 220 464 A1, which is hereby fully incorporated in the present application as part thereof.

It is also possible to design the first control unit 34 exclusively with vacuum-suitable components.

The second control unit 35 is connected to the first control unit 34 in a data-transmitting manner. A data connection 37 serves for the data- or signal-transmitting connection of the control units 34, 35. The data connection is, in particular, a high-speed data connection. The data connection 37 enables a data transmission rate of at least 50 megabits per second, in particular at least 100 megabits per second. The data connection 37 enables a data transmission with a latency of at most 1 millisecond, in particular at most 0.1 millisecond. The data connection 37 can be designed in a cable-based manner or be realized via optical waveguides. This is also referred to as line-conducted data connection 37. The cable-based alternative has the advantage that no light sources for generating the signals need be present in the evacuable chamber 19.

The data connection 37 includes, in particular, exclusively digital signal connections.

The data connection 37 can include, in particular, one or more BNC plug connections. The use of BNC connectors results in considerable cost advantages. It includes line pairs, in particular. It thus enables, in particular, a data transmission in both directions, i.e. from the first control unit 34 to the second control unit 35 and from the second control unit 35 to the first control unit 34. It is therefore also referred to as a duplex data connection. It enables a closed-loop control, in particular. The control device 31 includes a closed-loop control circuit, in particular. In this case, the actual controller can be designed as part of the second control unit 35 and be arranged outside the evacuable chamber 19, i.e. in the non-vacuum. The data connection 37 can also be implemented via optical fibers, in particular via optical fibers made of glass. This is also referred to as data transmission conducted by optical fibers made of glass. In general longer transmission distances can be bridged by optical fibers made of glass. It is possible, in particular, to bridge longer transmission distances substantially without any losses. With regard to the data transmission rate and the latency, reference should be made to the description above.

The data connection 37 can additionally be used for the voltage supply of $32_i$ and/or actuators $33_i$.

The data connection 37 enables a signal transmission through the vacuum boundary 38. The vacuum bushing 36 is provided for guidance through the vacuum boundary 38. The vacuum bushing 36 forms a constituent of the data connection 37. With regard to details of the vacuum bushing 36, reference should be made to DE 10 2013 220 464 A1.

In order to control the displacement positions of the mirror elements, in particular digital signals are guided via the data connection 37 via the vacuum boundary 38. In particular exclusively digital signals are guided via the vacuum boundary 38.

The first control unit 34 serves as a distributor for splitting and/or combining signals. It is also referred to as a distributor assembly or distributor box (dispatcher box). The first control unit 34 additionally serves as a converter for converting digital signals into analog signals and/or analog signals into digital signals. It has in particular an interface 39 to the data connection 37. The interface 39 includes at least one digital input 40 and at least one digital output 41.

The interface 39 can be of purely digital design. It can include a plurality of digital inputs 40 and/or digital outputs 41.

The first control unit 34 additionally has an analog interface 42. The analog interface 42 includes one or more analog inputs, in particular for the signals from the sensors $32_i$.

The first control unit 34 has an analog interface 43 having one or more analog outputs for the signals to the actuators $33_i$. The interfaces 42, 43 can be combined to form a single, combined interface.

The second control unit 35 is designed as a digital assembly. It is of purely digital design, in particular.

The number of digital outputs 41 of the first control unit 34 is less than the number of analog inputs of the analog interface 42. In particular, it is less than the number n of sensors $32_i$. The ratio of a number of analog inputs of the analog interface 42, in particular the number n of sensors $32_i$, to the number of digital outputs 41 of the first control unit 34 is in particular at least 10:1, in particular at least 20:1, in particular at least 30:1, in particular at least 50:1, in particular at least 100:1.

The number of digital inputs 40 of the first control unit 34 is less than number of analog outputs of the analog interface 43. In particular, it is less than the number m of actuators $33_i$. The ratio of the number of analog outputs of the analog interface 43 in particular the number m of actuators $33_i$, to the number of digital inputs 40 of the first control unit 34 is in particular at least 10:1, in particular at least 20:1, in particular at least 30:1, in particular at least 50:1, in particular at least 100:1.

The number of physical connections in the vacuum can thus be considerably reduced with the aid of the first control unit 34. This results in a considerable reduction of costs. Moreover, this reduces the risk of faulty connections.

The first control unit 34 makes it possible to replace a multiplicity of physical connections by logical connections (data packets). The logical connections can be realized with the aid of a small number of physical connections, in particular with the aid of a single physical connection.

The exemplary embodiments presented above relate to constituents of a projection exposure apparatus 1. The electronic architecture of the control device 31 is also advantageously useable for other applications, for example mask inspection and repair systems, laser or electron beam lithography systems.

Individual aspects of the disclosure, in particular of the control device 31, are described once again below in a manner outlining the main points: the control device 31 includes the first control unit 34, which is arranged in the vacuum. The first control unit 34 is connected to the superordinate control unit 35 in a data-transmitting manner via the data connection 37 designed as a high-speed data connection. The second control unit 35 is arranged outside the vacuum, i.e. in the non-vacuum. The data connection 27 crosses the vacuum boundary 38. It crosses the vacuum boundary 38 in particular in both directions.

The control device 31 forms a closed-loop control circuit arranged partly in the vacuum and partly in the non-vacuum. The closed-loop control circuit overlaps vacuum and non-vacuum. Digital information, in particular exclusively digital information, passes via the vacuum boundary 38.

The data connection 37 is designed as a duplex data connection.

The data connection 37 enables a high data transmission rate. The data transmission rate is in particular at least 50 megabits per second, in particular at least 100 megabits per second.

The data connection 37 enables a particularly short latency of the data transmission. The latency of the data transmission is in particular at most 1 millisecond, in particular at most 0.1 millisecond.

In the first control unit 34, signals from a plurality of sensors $32_i$ are combined to form an output signal. The output signal is transmitted via the digital output 41 to the second control unit 35.

In the first control unit 34, a digital control signal transmitted from the second control unit 35 to the first control unit 34 via the digital input 40 is split into a multiplicity of control signals for the actuators $33_i$.

Multiplexing of the sensor and/or actuator signals takes place in the first control unit 34. The sensor channels and/or actuator channels can be differentiated by suitable data transmission protocols, in particular packet-oriented data transmission protocols.

The signals from the sensors $32_i$ are converted into digital signals by the first control unit 34. The digitalization of the sensor signals thus takes place in the vacuum.

The digital control signals for the actuators $33_i$ are converted into analog actuator signals by the first control unit 34. The conversion of the digital actuator signals into analog actuator signals thus takes place in the vacuum.

In order to reduce the cables for the signal transmission, provision is made of signal bundling (multiplexing) and debundling (demultiplexing), respectively. The multiplexing and demultiplexing can be carried out via the first control unit 34, i.e. in the vacuum. The first control unit 34 includes in particular a multiplexing and/or a demultiplexing device.

What is claimed is:

1. A control device configured to be used in an assembly comprising a plurality of sensors and/or actuators, the control device comprising:
   a first vacuum-suitable control unit comprising:
      a distributor configured to: i) split signals; and/or ii) combine signals;
      a converter configured to: i) convert digital signals into analog signals; and/or ii) convert analog signals into digital signals; and
      a high-speed data connection to the first control unit in a signal-transmitting manner,
   wherein the high-speed data connection comprises a vacuum bushing, and
   wherein the control device has:
      at least one purely digital input and/or at least one purely digital output; and
      a plurality of analog inputs and/or a plurality of analog outputs.

2. The control device of claim 1, further comprising a second control unit comprising a digital assembly connected to the first control unit in a data-transmitting manner.

3. The control device of claim 1, wherein the high-speed data connection comprises at least one duplex data connection.

4. The control device of claim 1, wherein the control device has:
   a plurality of digital inputs and a plurality of analog outputs; and
   more analog outputs than digital inputs.

5. The control device of claim 4, wherein the control device has:
a plurality of analog inputs and a plurality of digital outputs; and
more analog inputs than digital outputs.

6. The control device of claim 1, wherein the control device has:
a plurality of analog inputs and a plurality of digital outputs; and
more analog inputs than digital outputs.

7. The control device of claim 1, further comprising at least one closed-loop control circuit overlapping a vacuum boundary.

8. An assembly, comprising:
a displaceable component in vacuo, the displaceable component comprising:
a plurality of sensors and/or a plurality of actuators; and
a control device according to claim 1,
wherein the control device is connected to the sensors and/or the actuators in a signal-transmitting manner.

9. A method of controlling the displacement positions of a plurality of components in a vacuum environment, the method comprising:
providing an assembly, comprising:
a displaceable component in vacuo, the displaceable component comprising:
a plurality of sensors and/or a plurality of actuators; and
a control device according to claim 1, the control device connected to the sensors and/or the actuators in a signal-transmitting manner; and
generating control signals via the control device,
wherein digital signals are guided via a vacuum boundary.

10. An illumination optical unit, comprising:
an assembly, comprising:
a displaceable component in vacuo, the displaceable component comprising:
a plurality of sensors and/or a plurality of actuators; and
a control device according to claim 1,
wherein the control device is connected to the sensors and/or the actuators in a signal-transmitting manner, and the illumination optical unit is a projection exposure illumination optical unit.

11. An illumination system, comprising:
a radiation source configured to generate illumination radiation; and
an illumination optical unit comprising:
an assembly, comprising:
a displaceable component in vacuo, the displaceable component comprising:
a plurality of sensors and/or a plurality of actuators; and
a control device according to claim 1,
wherein the control device is connected to the sensors and/or the actuators in a signal-transmitting manner, and the illumination optical unit is a projection exposure illumination optical unit.

12. A projection optical unit, comprising:
an assembly, comprising:
a displaceable component in vacuo, the displaceable component comprising:
a plurality of sensors and/or a plurality of actuators; and
a control device according to claim 1,
wherein the control device is connected to the sensors and/or the actuators in a signal-transmitting manner, and the projection optical unit is a projection exposure projection optical unit.

13. An apparatus, comprising:
an illumination optical unit;
a projection optical unit; and
an assembly, comprising:
a displaceable component in vacuo, the displaceable component comprising:
a plurality of sensors and/or a plurality of actuators; and
a control device according to claim 1,
wherein the control device is connected to the sensors and/or the actuators in a signal-transmitting manner, and the apparatus is a microlithographic projection exposure apparatus.

14. A method of using a microlithographic projection exposure apparatus comprising an illumination optical unit, a projection optical unit and an assembly, the method comprising:
using the illumination optical unit to illuminate a reticle; and
using the projection optical unit to project a portion of the illuminated reticle onto a light-sensitive material,
wherein:
the assembly comprises:
a displaceable component in vacuo, the displaceable component comprising:
a plurality of sensors and/or a plurality of actuators; and
a control device according to claim 1; and
the control device is connected to the sensors and/or the actuators in a signal-transmitting manner.

15. A control device configured to be used in an assembly comprising a plurality of sensors and/or actuators, the control device comprising:
a first vacuum-suitable control unit comprising:
a distributor configured to: i) split signals; and/or ii) combine signals; and
a converter configured to: i) convert digital signals into analog signals; and/or ii) convert analog signals into digital signals,
wherein the control device has:
at least one purely digital input and/or at least one purely digital output; and
a plurality of analog inputs and/or a plurality of analog outputs,
wherein the control device has:
a plurality of digital inputs and a plurality of analog outputs; and
more analog outputs than digital inputs.

16. The control device of claim 15, wherein the control device has:
a plurality of analog inputs and a plurality of digital outputs; and
more analog inputs than digital outputs.

17. The control device of claim 15, further comprising at least one closed-loop control circuit overlapping a vacuum boundary.

18. An assembly, comprising:
a displaceable component in vacuo, the displaceable component comprising:
a plurality of sensors and/or a plurality of actuators; and
a control device according to claim 15,
wherein the control device is connected to the sensors and/or the actuators in a signal-transmitting manner.

19. A control device configured to be used in an assembly comprising a plurality of sensors and/or actuators, the control device comprising:
- a first vacuum-suitable control unit comprising:
  - a distributor configured to: i) split signals; and/or ii) combine signals; and
  - a converter configured to: i) convert digital signals into analog signals; and/or ii) convert analog signals into digital signals,
- wherein the control device has:
  - at least one purely digital input and/or at least one purely digital output; and
  - a plurality of analog inputs and/or a plurality of analog outputs,
- wherein the control device has:
  - a plurality of analog inputs and a plurality of digital outputs; and
  - more analog inputs than digital outputs.

20. The control device of claim 19, further comprising at least one closed-loop control circuit overlapping a vacuum boundary.

* * * * *